(12) United States Patent
Korden et al.

(10) Patent No.: US 7,065,331 B2
(45) Date of Patent: Jun. 20, 2006

(54) RESONATOR CONFIGURATION

(75) Inventors: Christian Korden, München (DE);
Thomas Ostertag, Geretsried (DE);
Werner Ruile, München (DE)

(73) Assignee: Siemens Aktiengesellschaft, Munich (DE)

( * ) Notice: Subject to any disclaimer, the term of this patent is extended or adjusted under 35 U.S.C. 154(b) by 455 days.

(21) Appl. No.: 10/381,355

(22) PCT Filed: Sep. 20, 2001

(86) PCT No.: PCT/DE01/03642

§ 371 (c)(1),
(2), (4) Date: Mar. 25, 2003

(87) PCT Pub. No.: WO02/25813

PCT Pub. Date: Mar. 28, 2002

(65) Prior Publication Data

US 2004/0033794 A1    Feb. 19, 2004

(30) Foreign Application Priority Data

Sep. 25, 2000   (DE)   ............................ 100 473 431

(51) Int. Cl.
*H04B 1/18* (2006.01)
*H04B 1/16* (2006.01)
*H04B 1/26* (2006.01)

(52) U.S. Cl. ................ 455/150.01; 455/77; 455/178.1; 455/193.2; 455/197.3

(58) Field of Classification Search ............ 455/197.1, 455/193.2, 87, 340, 75–77, 178.1, 182.3, 455/191.1, 193.1, 197.3, 258–264
See application file for complete search history.

(56) References Cited

U.S. PATENT DOCUMENTS

| 4,633,422 A |   | 12/1986 | Brauer |
| 4,685,150 A | * | 8/1987  | Maier ...................... 455/183.2 |
| 4,736,456 A |   | 4/1988  | Maier |
| 5,329,319 A | * | 7/1994  | Sgrignoli ................... 348/733 |
| 5,428,829 A |   | 6/1995  | Osburn et al. |
| 5,559,481 A | * | 9/1996  | Satoh et al. ................ 333/193 |
| 5,678,211 A |   | 10/1997 | Badger |
| 5,691,698 A |   | 11/1997 | Scholl et al. |
| 5,748,044 A |   | 5/1998  | Xue |
| 5,793,261 A | * | 8/1998  | Boling, III .................. 332/102 |

(Continued)

FOREIGN PATENT DOCUMENTS

DE        195 40 139        4/1997

(Continued)

OTHER PUBLICATIONS

"The Problem of ON-Chip Automatic Tuning in Continuous-Time Integrated Filters" Schaumann et al, pp. 106-109.

*Primary Examiner*—Simon Nguyen
(74) *Attorney, Agent, or Firm*—Bell, Boyd & Lloyd LLC

(57) ABSTRACT

A resonator system and method are provided which includes/uses a tunable reference resonator, parts for tuning the reference resonator to a reference value via a controlled variable for the reference resonator, a tunable circuit resonator, and parts for tuning the circuit resonator which are designed such that the controlled variable for the reference resonator is used as a measure of the tuning of the circuit resonator, and wherein the reference resonator and/or the circuit resonator is/are designed as a surface acoustic wave component, a bulk acoustic wave component and/or a diaphragm oscillator.

16 Claims, 1 Drawing Sheet

U.S. PATENT DOCUMENTS

| | | |
|---|---|---|
| 5,841,214 A | 11/1998 | Schmidt et al. |
| 5,910,779 A | 6/1999 | Bulst et al. |
| 5,966,008 A | 10/1999 | Maier et al. |
| 6,029,324 A | 2/2000 | Wixforth |
| 6,084,503 A | 7/2000 | Ruile et al. |
| 6,307,440 B1 * | 10/2001 | Shimanuki ............... 331/181 |
| 6,535,545 B1 * | 3/2003 | Ben-Bassat et al. ........ 375/142 |
| 6,694,026 B1 * | 2/2004 | Green ......................... 381/3 |

FOREIGN PATENT DOCUMENTS

| | | |
|---|---|---|
| DE | 198 60 058 | 3/2000 |
| EP | 0 619 906 | 10/1994 |
| EP | 0 651 344 | 5/1995 |
| EP | 0655 701 | 5/1995 |
| EP | 0 746 775 | 12/1996 |
| WO | WO 00/28664 | 5/2000 |

* cited by examiner

RESONATOR CONFIGURATION

BACKGROUND OF THE INVENTION

The present invention relates, generally, to a resonator system and a method for resonator tuning.

Resonators are subject to certain manufacturing fluctuations in production. Furthermore, aging and temperature fluctuations occur during operation. This has the effect that the frequency position of a circuit resonator used in a circuit generally does not correspond exactly to the manufacturing specifications and also can vary over the course of time.

However, it is of crucial importance, particularly in the case of modern telecommunications devices, such as, for example, mobile telephones and other mobile terminals, that circuit resonators are used with a frequency position that is predetermined as exactly as possible. This is all the more true for direct conversion methods, whose use is spreading and which can only be achieved with filters that operate extremely precisely.

To date, resonators in the form of surface acoustic wave components have been used for filters in the abovementioned area of use. Such surface acoustic wave components are disclosed, for example, in DE 198 60 058 C1, EP 0 746 775B1, EP 0 655 701B1, EP 0 651 344B1, EP 0 619 906B1, U.S. Pat. No. 5,691,698, U.S. Pat. No. 5,841,214, U.S. Pat. No. 5,966,008, U.S. Pat. No. 5,910,779, U.S. Pat. No. 6,029,324, U.S. Pat. No. 6,084,503. They are distinguished, in particular, by a high long-term stability.

Unfortunately, these surface acoustic wave components cannot be integrated into semiconductor technology, for which reason hybrid solutions have to be pursued. In order to depart from these hybrid solutions, FBARs(Film Bulk Acoustic Resonators) are known, which can be produced at least partly in CMOS-compatible fashion. In this case, however, the required frequency accuracy cannot be mastered in terms of production engineering, so that mass production and, hence, low prices are not available.

U.S. Pat. No. 5,428,829 describes active filters which are integrated in semiconductor technology; in particular, in CMOS technology. An active filter circuit is excited to effect oscillation via specific settings of gain and phase angle and is used as an oscillator in a PLL. Quality factor and center frequency can be regulated by electrically tunable resistors and capacitors in the form of external circuitry in CMOS.

Taking this as a departure point, the present invention is directed toward a resonator system and a method for resonator tuning which can be used to compensate for production, temperature and aging fluctuations of the resonators. Furthermore, the resonator system and the method for resonator tuning are intended to be suitable, in particular, for microstructured and integrated components.

SUMMARY OF THE INVENTION

Accordingly, the present invention is based, firstly, on the insight of using tunable resonators instead of resonators having defined properties; in particular, a predetermined frequency position. Although on first impression such tunable resonators appear to be less suited to achieving the predetermined object, because they are quite generally subject to even greater production, temperature and aging fluctuations, this apparent disadvantage nonetheless can be compensated for by the resonator system according to the present invention and the method for resonator tuning.

In accordance with the resonator system, a reference resonator is also used in addition to the actual circuit resonator. Both reference resonator and circuit resonator are tunable. This is based on the idea that the reference resonator and the circuit resonator are subject, approximately, to the same production, temperature and aging fluctuations. The reference resonator is tuned via a controlled variable such that its resonator value corresponds to a predetermined reference value. A frequency position, in particular, is taken into consideration as resonator value or predetermined reference value.

Afterward, the circuit resonator is tuned, with the controlled variable for the reference resonator being used as a measure of the tuning of the circuit resonator.

The resonator system is embodied with microstructured and/or integrated components. The reference resonator and/or the circuit resonator are/is embodied as a surface acoustic wave component (SAW component), bulk acoustic wave component (FBAR) and/or diaphragm oscillator, these being sufficiently tunable.

The present invention can be achieved particularly well with an oscillator circuit. In order to compensate for the production, temperature and aging fluctuations, the reference resonator is arranged in an oscillator circuit in which it is an element which determines the oscillator circuit frequency. If the oscillator circuit frequency corresponds to a predetermined reference frequency, then one can, therefore, be certain that the reference resonator has the desired electrical values.

In order for the oscillator circuit frequency to correspond approximately to the reference frequency, the reference resonator is correspondingly tuned by tuning the reference resonator via a controlled variable for the reference resonator. The controlled variable for the reference resonator is then used as a measure of the tuning of the circuit resonator. The circuit resonator can, thus, be tuned in a manner dependent on the controlled variable for the reference resonator.

If reference resonator and circuit resonator are identical and if they are intended to assume the same electrical values, then in the simplest case the controlled variable for the reference resonator corresponds to the controlled variable for the circuit resonator, with which the latter is then tuned to the electrical values of the reference resonator. However, more complicated relationships are also conceivable, for instance if reference resonator and circuit resonator are to be intentionally detuned with respect to one another or the parts for tuning the reference resonator are designed differently than the parts for tuning the circuit resonator. What is essential, rather, is the concept of using the tuning behavior of the reference resonator and, in particular, the controlled variable used for this for the reference resonator as a source of information in order to set the circuit resonator to the desired electrical values. In this case, the circuit resonator remains free of parts which measure its electrical values, and therefore can be used independently in arbitrary circuits.

The correct tuning of the reference resonator can be achieved, in particular, by virtue of the fact that the reference resonator is arranged in an oscillator circuit and the resonator system has parts for comparing the oscillator circuit frequency with a reference frequency. For the reference value of the reference resonator, a reference frequency is produced for the oscillator circuit frequency. If the tunable reference resonator is then tuned by the parts for tuning the reference resonator in such a way that the oscillator circuit frequency corresponds approximately to the reference frequency, the resonator value of the tunable reference resonator is approximately equal to the predetermined reference value. If the circuit resonator is arranged in a filter circuit, then the resonator system can be used for all conceivable filter purposes. To that end, the resonator system may be arranged in a mobile terminal; in particular, a mobile telephone.

It is also possible to use a number of reference resonators and/or circuit resonators in the resonator system, in which case each circuit resonator may be assigned a dedicated reference resonator or a number of circuit resonators are associated with the same reference resonator.

If the resonator system has a second tunable circuit resonator, then the circuit resonator and the second circuit resonator can be arranged in a ladder-type filter in which one of the circuit resonators is connected in series with the useful signal, while the other is grounded in a parallel circuit with respect thereto. Pursuant to this arrangement, a bandpass filter can be achieved even with single-gate circuit resonators. As required, the second circuit resonator can be detuned with respect to the circuit resonator.

In accordance with the basic concept that reference resonator and circuit resonator are intended to be subject approximately to the same production, temperature and aging fluctuations, it is particularly advantageous to produce them from the same wafer. In this case, the reference resonator and the circuit resonator still do not even have to be separated from one another after production, since a particularly good thermal connection between the resonators is ensured precisely as a result of this. It is also advantageous if the resonator system has parts for thermally connecting the reference resonator and the circuit resonator to one another. In order for the connecting paths to be kept as short as possible and the temperature difference between the reference resonator and the circuit resonator to be kept as small as possible, the reference resonator and the circuit resonator are to be arranged adjacent.

Problems can arise from the crosstalk of the oscillator circuit to the circuit resonator and the circuit assigned thereto. In order to avoid these problems, the oscillator circuit can be operated temporally discontinuously, the oscillator circuit being switched off as soon as the circuit in which the circuit resonator is arranged becomes active.

As an alternative, crosstalk can be prevented by the oscillator circuit frequency lying outside the useful bandwidth of the filter circuit in which the circuit resonator is arranged.

If the resonator system has setting parts for setting and/or generating a circuit frequency signal which is mixed with the output signal of the filter circuit, it is possible, finally, as a third alternative, to design the setting parts in such a way that the oscillator circuit frequency can also be set by the setting parts. In particular, to that end, the oscillator circuit may have an oscillator which is designed in such a way that it also serves as an oscillator for the circuit in which the circuit frequency signal is generated. This alternative can be used, in particular, in connection with the direct conversion method. A major advantage of this operating mode is that no additional components are required.

Additional features and advantages of the present invention are described in, and will be apparent from, the following Detailed Description of the Invention and the Figures.

DETAILED DESCRIPTION OF THE INVENTION

Figure 1:
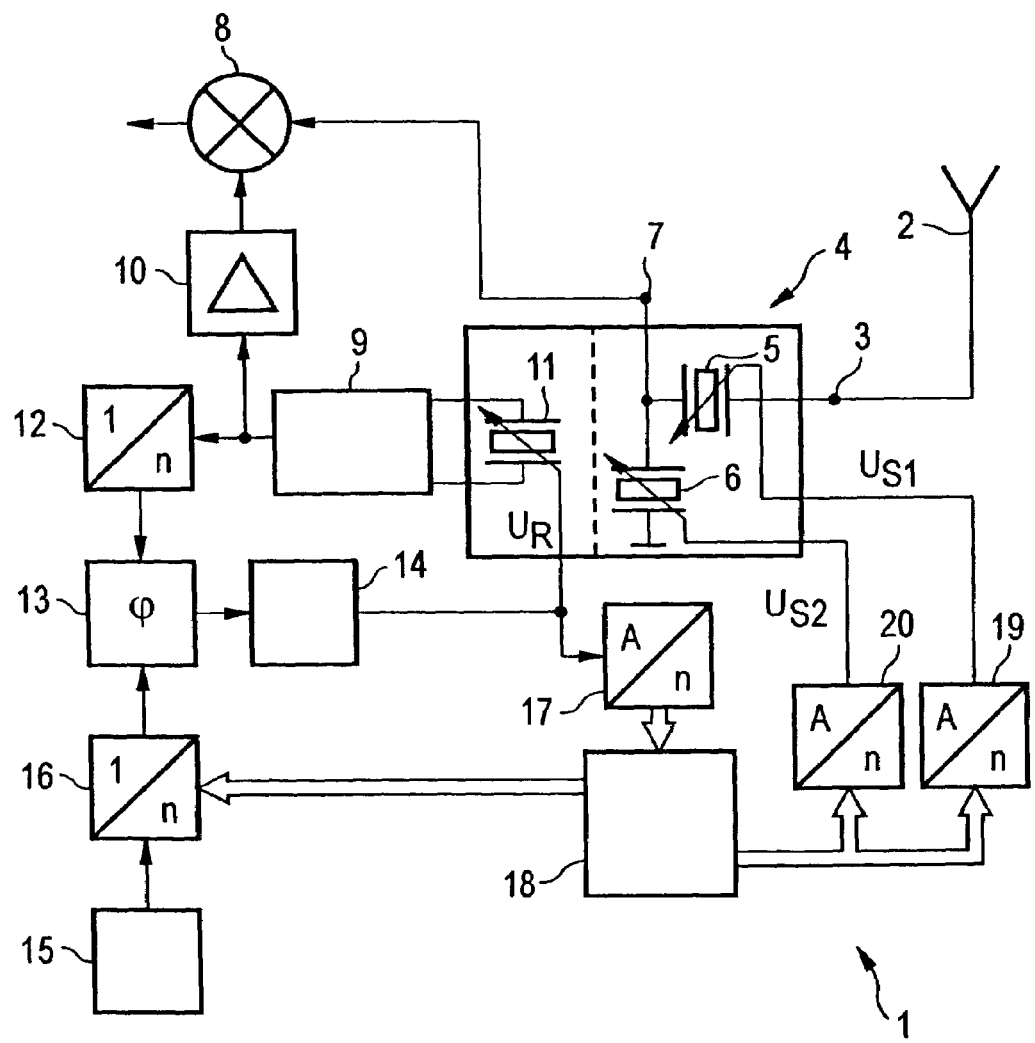
FIG. 1 shows a resonator system in accordance with the teachings of the present invention.

FIG. 1 reveals a resonator system 1 with an antenna 2, via which a radio frequency signal is received and passed to the input 3 of the resonator system 1. The radio frequency signal is, in particular, a mobile radio signal according to the GSM or UMTS standard, a signal according to the Bluetooth standard or another digital or analog signal which serves for transmitting information. A filter 4 containing a tunable circuit resonator 5 and a second tunable circuit resonator 6 is arranged at the input 3 of the resonator system. The filter 4 is constructed as a ladder-type filter in which the circuit resonator 5 is connected in series in the radio frequency signal path, while the second circuit resonator 6 is grounded in a parallel circuit with respect to the signal path. The filtered radio frequency signal leaves the filter as output signal of the filter circuit at the filter output 7 and is mixed in a mixer 8 with an oscillator signal, generated by an oscillator 9, to form an intermediate frequency signal. Before the oscillator signal from the oscillator 9 reaches the mixer 8, it passes through a buffer amplifier 10.

The oscillator 9 is embodied as a voltage-controlled oscillator (VCO). It is arranged with a reference resonator 11 in an oscillator circuit. The reference resonator 11 is linked into a phase-locked loop (PLL). To that end, the oscillator circuit signal is fed to a phase comparator 13 via a programmable divider 12. Via a comparison frequency generator 15, which is embodied, in particular, as a stabilized bulk acoustic oscillator, preferably as a quartz crystal, and a programmable divider 16, a comparison frequency is passed to the phase comparator 13, at whose output there is available the controlled variable $U_R$ for the reference resonator 11, the controlled variable being filtered by the low-pass filter 14. It is, thus, ensured that the reference resonator 11 has its predetermined reference value.

The oscillator circuit signal is fed to a microcontroller 18 via an A/D converter 17. The controlled variable $U_R$ for the reference resonator 11 is used by the microcontroller 18 as a measure of the tuning of the tunable circuit resonator 5. To that end, in a manner dependent on the controlled variable $U_R$ for the reference resonator 11, a controlled variable $U_{S1}$ for the tunable circuit resonator 5 is calculated, which, as prescribed by the microcontroller 18, is converted by the D/A converter 19 and applied to the tunable circuit resonator 5.

In an analogous manner, a controlled variable $U_{S2}$ for the second circuit resonator 6 is generated in a manner dependent on the controlled variable $U_R$ for the reference resonator 11 by a further D/A converter.

The second circuit resonator 6 is slightly detuned with respect to the circuit resonator 5 in order to ensure a bandpass function of the filter 4. For the case where the circuit resonator 5 and the second circuit resonator 6 are identical, there is applied to the second circuit resonator 6 a controlled variable $U_{S2}$ for the second circuit resonator 6 which deviates from the controlled variable $U_{S1}$ for the circuit resonator 5 which is applied to the circuit resonator 5.

For simple applications, however, it is also possible to dispense with the microcontroller 18 and the converters 17, 19 and 20 by applying the same controlled variables $U_R$, $U_{S2}$ and $U_{S1}$ to all the resonators. Furthermore, it is conceivable for the controlled variables $U_R$, $U_{S1}$ and $U_{S2}$ to be put into a desired, fixed ratio; for example, via a voltage divider.

The reference resonator 11, the circuit resonator 5 and the second circuit resonator 6 are embodied on the same wafer 21 and are thermally connected to one another by the latter.

The bandwidth and/or the center frequency of the filter 4 can be set via the controlled variable $U_{S1}$ for the circuit resonator 5 and the controlled variable $U_{S2}$ for the second circuit resonator 6 or the ratio of the controlled variables to another.

The microcontroller 18 can determine the controlled variable $U_{S1}$ for the circuit resonator 5 and the controlled variable $U_{S2}$ for the second circuit resonator 6 in a manner dependent on the controlled variable $U_R$ for the reference resonator 11 via a fixed mathematical relationship. However, the use of neural networks is also conceivable here.

One possible problem is the isolation between the reference resonator 11 and the circuit resonators 5, 6 of the filter 4. A crosstalk between the oscillator 9 and the filter 4 can be avoided via the following operating modes of the control:

a) If the oscillator 9 operates within the useful bandwidth of the filter 4, the controlled variable $U_R$ for the reference resonator 11 is determined in temporally offset fashion with respect to the time segments in which the filter 4 is active. If the resonator system 1 is a resonator system for a mobile telephone which is used as a filter in the reception path, then it is possible, for example, to utilize the transmission windows for the operation of the oscillator circuit. Using the short-term stability of the resonator system 1, the controlled variables $U_{S1}$ and $U_{S2}$ for the circuit resonators 5, 6 are held in the reception window and the oscillator 9 is switched off during this time.

b) The oscillator 9 is operated continuously outside the useful bandwidth of the filter 4. Given a known gradient of the tuning characteristic curves of the resonators, the present controlled variables $U_{S1}$ and $U_{S2}$ for the circuit resonators can be extrapolated for the circuit resonators 5, 6.

c) The oscillator 9 is simultaneously used as a local oscillator (LO) for a transmitting/receiving circuit in which the circuit resonator 5 is arranged. Precisely in direct conversion methods, the operating frequency of the local oscillator is close to or the same as the reception frequency (true direct conversion or low-IF). A major advantage of this operating mode is that no additional components are required. The additional control functionality is attained from the microcontroller 18 already present.

Although the present invention has been described with reference to specific embodiments, those of skill in the art will recognize that changes may be made thereto without departing from the spirit and scope of the present invention as set forth in the hereafter appended claims.

The invention claimed is:

1. A resonator system, comprising:
   a tunable reference resonator;
   parts for tuning the reference resonator to a reference value via a controlled variable for the tunable reference resonator;
   a first tunable circuit resonator; and
   parts for tuning the first tunable circuit resonator wherein the controlled variable for the tunable reference resonator is used as a measure of the tuning of the first tunable circuit resonator;
   wherein at least one of the tunable reference resonator and the first tunable circuit resonator are arranged as at least one of a circuit acoustic wave component, a bulk acoustic wave component, and a diaphragm oscillator.

2. A resonator system as claimed in claim 1, further comprising:
   an oscillator circuit which includes the tunable reference resonator; and
   parts for comparing an oscillator circuit frequency with a reference frequency;
   wherein the parts for tuning the tunable reference resonator are designed such that, through the tuning of the tunable reference resonator, the oscillator circuit frequency is set to the reference frequency.

3. A resonator system as claimed in claim 2, further comprising a filter in which the first tunable circuit resonator is arranged.

4. A resonator system as claimed in claim 3, wherein the oscillator circuit frequency lies outside a useful bandwidth of the filter.

5. A resonator system as claimed in claim 2, wherein the oscillator circuit can be operated temporally discontinuously.

6. A resonator system as claimed in claim 5, further comprising a transmitting and/or receiving circuit in which the circuit resonator is arranged.

7. A resonator system as claimed in claim 6, wherein the oscillator circuit can be switched off as soon as the transmitting and/or receiving circuit respectively transmits and/or receives.

8. A resonator system as claimed in claim 2, further comprising setting parts for setting a circuit frequency signal which is mixed with an output signal of a filter circuit, the setting parts being designed such that the oscillator circuit frequency also can be set by the setting parts.

9. A resonator system as claimed in claim 2, wherein the oscillator circuit includes an oscillator which further serves as an oscillator for a circuit in which a circuit frequency signal is generated.

10. A resonator system as claimed in claim 1, further comprising at least one second tunable circuit resonator.

11. A resonator system as claimed in claim 10, wherein the first and second tunable circuit resonators are detuned with respect to one another.

12. A resonator system as claimed in claim 10, further comprising a ladder-type filter in which the first and second tunable circuit resonators are arranged.

13. A resonator system as claimed in claim 1, wherein the tunable reference resonator and the first tunable circuit resonator originate from a same wafer.

14. A resonator system as claimed in claim 1, wherein the tunable reference resonator and the first tunable circuit resonator are adjacently arranged.

15. A resonator system as claimed in claim 1, further comprising parts for thermally coupling the tunable reference resonator and the first tunable circuit resonator.

16. A method for resonator tuning, the method comprising the steps of:
   tuning a tunable reference resonator to a reference value via a controlled variable for the reference resonator; and
   using the controlled variable for the reference resonator as a measure of the tuning of at least one tunable circuit resonator;
   wherein at least one of the reference resonator and the circuit resonator is designed as at least one of a surface acoustic wave component, a bulk acoustic wave component, and a diaphragm oscillator.

* * * * *